United States Patent
Lloyd et al.

(10) Patent No.: US 6,290,865 B1
(45) Date of Patent: Sep. 18, 2001

(54) SPIN-RINSE-DRYING PROCESS FOR ELECTROPLATED SEMICONDUCTOR WAFERS

(75) Inventors: Mark Lloyd, Fremont; Ashok K. Sinha, Palo Alto; Sergio Edelstein, Los Gatos; Michael Sugarman, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/201,566

(22) Filed: Nov. 30, 1998

(51) Int. Cl.$^7$ ............................................. C23F 1/00
(52) U.S. Cl. ..................... 216/92; 438/748; 438/928
(58) Field of Search .................... 438/748, 754, 438/928; 216/92, 106

(56) References Cited

U.S. PATENT DOCUMENTS

| | | | |
|---|---|---|---|
| 3,727,620 | 4/1973 | Orr | 134/95 |
| 3,770,598 | 11/1973 | Creutz | 204/52 R |
| 3,772,105 | * 11/1973 | Shipley | 216/92 |
| 4,027,686 | 6/1977 | Shortes et al. | 134/95 |
| 4,092,176 | 5/1978 | Kozai et al. | 134/186 |
| 4,110,176 | 8/1978 | Creutz et al. | 204/52 R |
| 4,113,492 | 9/1978 | Sato et al. | 96/67 |
| 4,315,059 | 2/1982 | Raistrick et al. | 429/112 |
| 4,336,114 | 6/1982 | Mayer et al. | 204/52 R |
| 4,376,685 | 3/1983 | Watson | 204/52 R |
| 4,405,416 | 9/1983 | Raistrick et al. | 204/68 |
| 4,439,244 | 3/1984 | Allevato | 134/33 |
| 4,489,740 | 12/1984 | Rattan et al. | 134/140 |
| 4,510,176 | 4/1985 | Cuthbert et al. | 427/82 |
| 4,518,678 | 5/1985 | Allen | 430/311 |
| 4,519,846 | 5/1985 | Aigo | 134/15 |
| 4,693,805 | 9/1987 | Quazi | 204/192.22 |
| 4,732,785 | * 3/1988 | Brewer | 427/240 |
| 5,039,381 | 8/1991 | Mullarkey | 204/47.5 |
| 5,055,425 | 10/1991 | Leibovitz et al. | 437/195 |

(List continued on next page.)

FOREIGN PATENT DOCUMENTS

| | | |
|---|---|---|
| 4109955A1 | 10/1992 | (DE) . |
| 4202194 A1 | * 7/1993 | (DE) ..................................... 216/92 |
| 2623134 A1 | * 5/1989 | (FR) . |
| 3-220723 | * 9/1991 | (JP) . |
| 05160104 | 12/1991 | (JP) . |
| 5-160104 | * 6/1993 | (JP) . |
| 6-97136 | * 4/1994 | (JP) . |
| 08037143 | 7/1994 | (JP) . |

OTHER PUBLICATIONS

Censak, R.J. et al "Spin Basket" IBM Tech. Discl. Bull. vol. 18, No. 8, pp. 2476–2477, Jan. 1976.*

PCT International Patent Search Report on PCT/US99/27855 dated Mar. 27, 2000.

Peter Singer, "Wafer Processing," Semiconductor International, Jun., 1998, p. 70 "Nonuniformity of Copper Electroplating Studied".

Primary Examiner—Randy Gulakowski
Assistant Examiner—Allan Olsen
(74) Attorney, Agent, or Firm—Thomason, Moser & Patterson, L.L.P.

(57) ABSTRACT

The present invention removes unwanted deposited material from a substrate backside by chemically dissolving the material, while substantially preventing dissolution of the material from the substrate front side. Preferably, the dissolving process is included with a spin-rinse-dry process and uses a greater flow rate of rinsing fluid directed onto the front side compared to the flow rate of dissolving fluid directed onto a substrate backside to protect the substrate front side while the unwanted backside material is removed. The present invention includes the method of dissolving the unwanted material from the backside and edge and the associated apparatus.

17 Claims, 5 Drawing Sheets

U.S. PATENT DOCUMENTS

| | | | |
|---|---|---|---|
| 5,155,336 | 10/1992 | Gronet et al. | 219/411 |
| 5,162,260 | 11/1992 | Leibovitz et al. | 437/195 |
| 5,222,310 | 6/1993 | Thompson et al. | 34/202 |
| 5,224,504 | 7/1993 | Thompson et al. | 134/155 |
| 5,230,743 | 7/1993 | Thompson et al. | 134/32 |
| 5,252,807 | 10/1993 | Chizinsky | 219/390 |
| 5,256,274 | 10/1993 | Poris | 205/123 |
| 5,259,407 | 11/1993 | Tuchida et al. | 134/151 |
| 5,290,361 | 3/1994 | Hayashida et al. | 134/2 |
| 5,316,974 | 5/1994 | Crank | 437/190 |
| 5,328,589 | 7/1994 | Martin | 205/296 |
| 5,349,978 | 9/1994 | Sago et al. | 134/153 |
| 5,368,711 | 11/1994 | Poris | 204/193 |
| 5,377,708 | 1/1995 | Bergman et al. | 134/105 |
| 5,429,733 | 7/1995 | Ishida | 204/224 R |
| 5,482,174 * | 1/1996 | Namiki et al. | 216/92 |
| 5,608,943 | 3/1997 | Konishi et al. | 15/302 |
| 5,625,170 | 4/1997 | Poris | 177/50 |
| 5,651,865 | 7/1997 | Sellers | 204/192.13 |
| 5,705,223 | 1/1998 | Bunkofske | 427/240 |
| 5,718,813 | 2/1998 | Drummond et al. | 204/192.12 |
| 5,723,028 | 3/1998 | Poris | 204/231 |
| 5,879,577 * | 3/1999 | Weng et al. | 216/92 |
| 5,897,379 * | 4/1999 | Ulrich et al. | 438/754 |
| 6,017,437 * | 1/2000 | Ting et al. | 205/80 |

\* cited by examiner

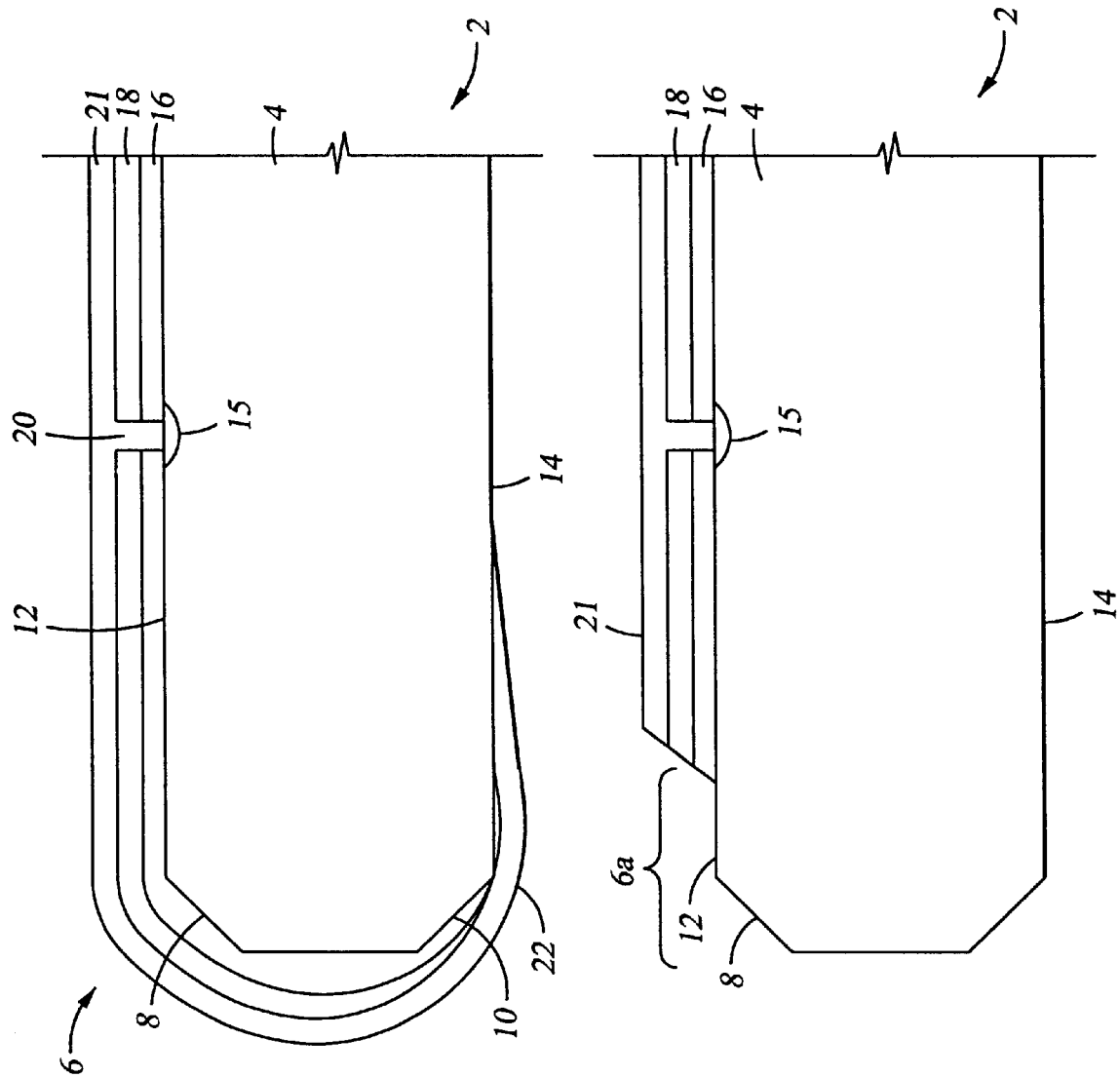

SPIN-RINSE-DRYING PROCESS FOR ELECTROPLATED SEMICONDUCTOR WAFERS

BACKGROUND OF THE INVENTION

1. Field

The present invention relates to cleaning of unwanted materials deposited on a substrate or other workpiece. Specifically, the invention relates to dissolving deposited metals from the backside and/or edge of a substrate following a deposition.

2. Background

Sub-quarter micron multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts and other features, as well as the dielectric materials between them, decrease to less than 0.25 μm, whereas the thickness of the dielectric layers remains substantially constant, with the result that the aspect ratios for the features, i.e., their height divided by width, increases. Many traditional deposition processes have difficulty filling structures where the aspect ratio exceeds 4:1, and particularly where it approaches 10:1. Additionally, as the feature widths decrease, the device current remains constant or increases, which results in an increased current density in the feature.

Aluminum and its alloys have been the traditional metals used to form lines and plugs and other features in semiconductor processing. However, with the increase in circuit densities, copper is becoming a choice metal for filling sub 0.25 μm, high aspect ratio interconnect features on semiconductor substrates. Copper and its alloys have lower resistivities compared to aluminum and high electromigration resistance. These characteristics are important for supporting the higher current densities experienced at high levels of integration and increased device speed. Copper also has good thermal conductivity and is available in a highly pure state.

Despite the desirability of using copper for semiconductor device fabrication, choices of fabrication methods for depositing copper into very high aspect ratio features, such as a 10:1 aspect ratio, 0.25 μm wide vias are limited. Precursors for CVD deposition of copper are being developed, and physical vapor deposition into such small features has produced unsatisfactory results because of voids formed in the features. As a result of these process limitations, electroplating, which had previously been used primarily in circuit board fabrication in the electronics industry, is being used to fill features, such as vias, on semiconductor devices. Thus, efforts are being explored to improve the electroplating process to be suitable for substrate manufacturing, especially in high aspect ratio features of substrates.

FIG. 1 is a partial cross section representing a substrate edge with a series of layers deposited thereon. The substrate 2 has a silicon base 4 with an edge profile 6 that typically is beveled with a first bevel 8 on a front side 12 and a second bevel 10 on a backside 14. The base has doped regions 15 that connect to feature 20, such as the contact shown, to form a portion of the circuitry of the semiconductor. A dielectric layer 16 is deposited on the base 4 and is etched to form apertures, followed by the deposition of a barrier layer 18, using Ti, TiN, Ta, TaN, and other known materials. The barrier layer reduces migration and diffusion of adjacent layers and may also provide good adhesion to the silicon oxide and subsequent metal layer. A conductive layer 21, typically aluminum or copper, is deposited over the barrier layer, such as by electroplating, and fills the apertures to form the interconnects between the layers.

The integrity of the barrier layer in the edge region is sometimes compromised in that typical processes such as physical vapor deposition (PVD) and chemical vapor deposition (CVD) may not uniformly deposit around the edge profile. Thus, the conductive layer material may diffuse into the underlying layers and poison the semiconductor device. Furthermore, some backside deposit 22 may occur on the second surface 14, further heightening the possibility of unwanted diffusion into the layers. Because copper has a high diffusion capability and can poison the device, this unwanted deposition can adversely affect the performance gains achieved using copper. Therefore, a preferred substrate fabrication process would remove this copper or other unwanted materials from the backside or from other surfaces where it may have been deposited.

FIG. 2 is a partial cross section representing a desired deposition profile on the substrate 2. The layers are distanced from the edge of the substrate to form an edge exclusion zone 6a. In PVD and CVD processing which are typically dry processes, the ability to define the edge exclusion zone is well known, using for instance, clamp rings, shadow rings, and purge gases. However, electroplating is typically a wet process on a substrate facing downward and is more difficult to control, leading to backside and edge deposits on the substrate. If, for instance, the layers had been deposited as in FIG. 1, then it would be advantageous to remove the layers from the edge to allow the edge exclusion zone. The edge exclusion zone 6a may be from about 1 mm to about 3 mm or more. In processing, there would be less likelihood of the edge deposits being dislocated from the substrate, thereby contaminating subsequent substrates, and less likelihood of unwanted diffusion through the layers.

An advantageous process to reduce or eliminate the unwanted deposition would preferably combine with an existing stage in the electroplating process. Part of the electroplating process involves rinsing the substrate after depositing the material, where the substrate is typically taken to a spin-rinse-dry chamber, represented in FIG. 3. A spin-rinse-dry chamber 23 includes a cover 23a which helps retain the fluids in the chamber. The chamber also includes a chamber top 23b, to which the cover 23a attaches, and a chamber bottom 23c. In one commercial system, the chamber top and bottom separate with a chamber lift 25 to allow a robot (not shown) to insert a substrate 2 into the chamber onto the pedestal 26. The pedestal 26 may have a vacuum port 26a in each pedestal arm 26b that are ultimately connected to a vacuum source 28, where the pedestal arms hold and center the substrate 2 to the pedestal. The pedestal or portion thereof may raise and lower to contact the substrate delivered by the robot. The pedestal 26 supports the substrate 2 during processing. The pedestal actuator 27 rotates the pedestal to spin the substrate to assist in rinsing and/or drying. The chamber top 23b generally includes a plurality of spray nozzles 29. These nozzles spray the rinsing fluid to impact and rinse the substrate surface. Typical rinsing fluids are deionized water, alcohol, or a combination thereof. After rinsing, the pedestal continues to spin the substrate, perhaps at a different speed, to effectively dry the surface.

Therefore, there remains a need for an apparatus and method to remove unwanted backside and edge depositions on a substrate, preferably by integrating the removal process into a spin-rinse-dry chamber.

SUMMARY

The present invention provides a method and apparatus to remove unwanted deposited material from a substrate backside by chemically dissolving the material, while at least partially protecting the substrate front side from the effects of this dissolution and removal process. Preferably, the dissolving process is included with a spin, rinse, and dry process and uses a greater flow of rinsing fluid onto the front side of the substrate compared to the flow of dissolving fluid onto the backside of the substrate to prevent the material from being removed from the front side of the substrate.

In one embodiment, the present invention provides a method of dissolving a film of deposited material on a substrate in a chamber adapted to spin and rinse the substrate, comprising spinning a substrate having a film of deposited material on at least a first surface, rinsing the film on the first surface, dissolving at least a part of any film on a substrate second surface, while rinsing the film on the first surface and substantially preventing dissolution of the film on the first surface. In another embodiment, the present invention a method of dissolving a material, deposited on a front side of a substrate and at least a portion of a backside of the substrate, comprising directing a fluid onto the material deposited on the substrate front side, while dissolving at least a portion of any material deposited on the substrate backside without substantially dissolving the material on the substrate front side.

In another embodiment, the present invention provides an apparatus for dissolving material deposited on a substrate backside, comprising a chamber adapted to spin and rinse the substrate, a substrate holder located at least partially inside the chamber, an actuator adapted to rotate the substrate holder, a first fluid inlet oriented to flow a fluid onto a substrate first surface in the chamber, a second fluid inlet oriented to flow a second fluid onto a substrate second surface in the chamber wherein at least one of the fluid inlets is adapted to flow a rinsing fluid and at least one other of the fluid inlets is adapted to flow a dissolving fluid with the flow of the first fluid during at least a portion of the dissolving process so that the dissolving fluid dissolves the deposited material on a substrate second surface without substantially dissolving the material on the substrate first surface.

BRIEF DESCRIPTION OF DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a partial cross section of a substrate with a series of layers deposited thereon.

FIG. 2 is a partial cross section of the substrate edge representing a desired configuration of deposited material on the substrate.

DETAILED DESCRIPTION OF A PREFERRED EMBODIMENT

In at least one aspect, the present invention provides a unique method and apparatus for removing a deposited material from at least a portion of a substrate surface in situ during a spin-rinse-dry process. The present invention may include directing a rinse solution onto a substrate front side having the deposited material while removing the material from at least a portion of the substrate backside by directing dissolving solution to the backside of the substrate.

Figure 3:
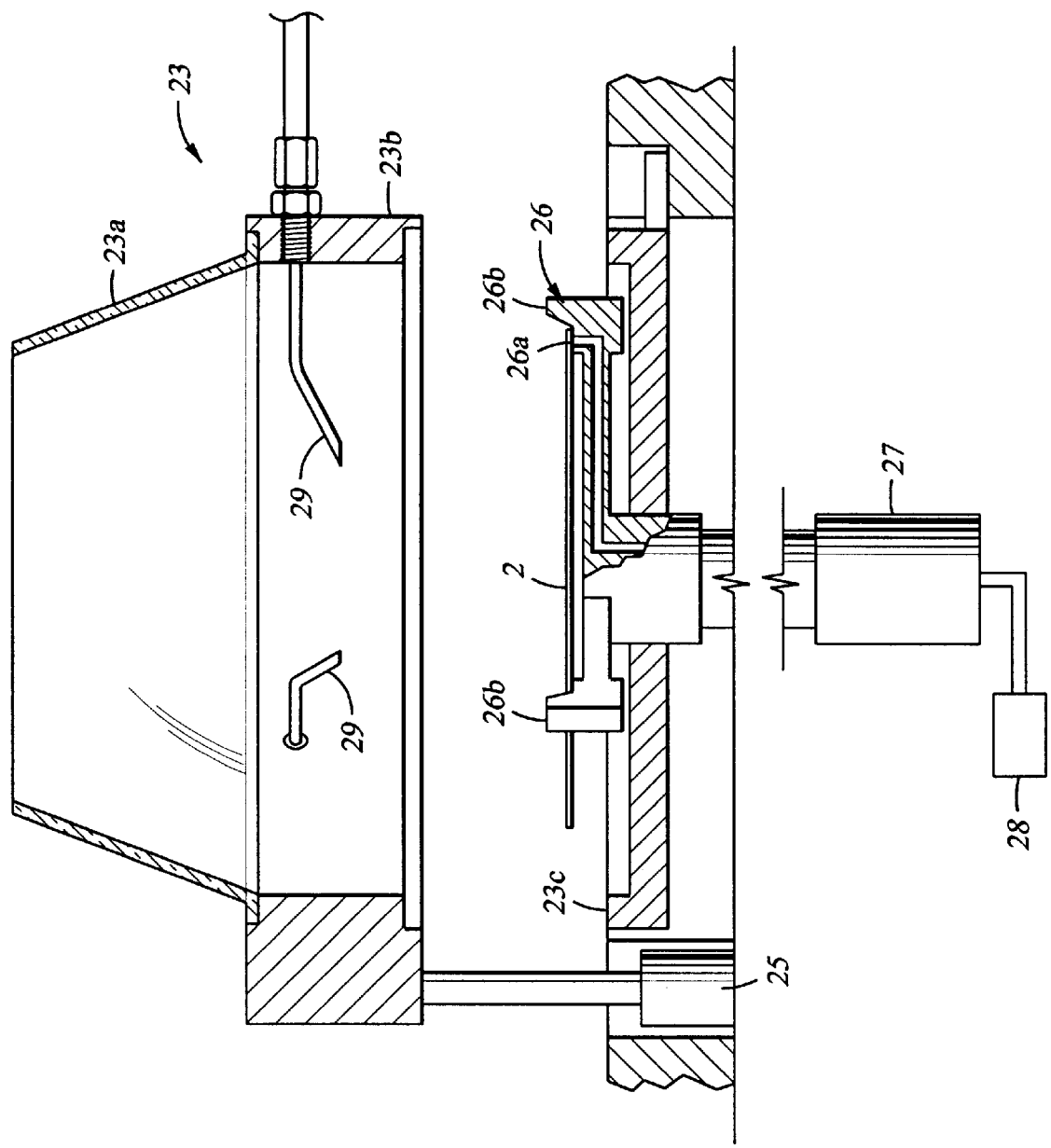
FIG. 3 is a schematic of a typical spin-rinse-dry chamber.
Figure 4:
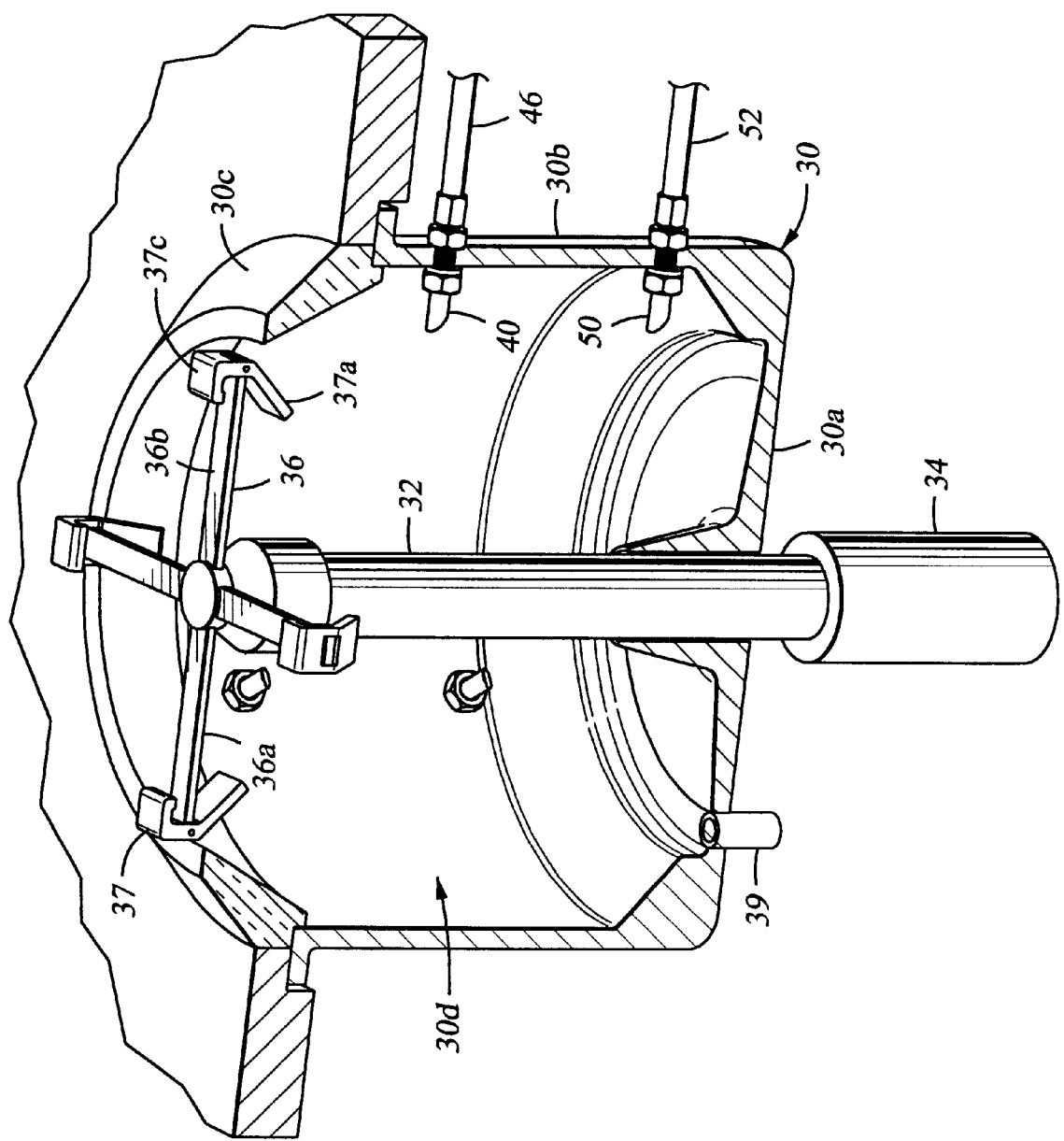
FIG. 4 is a schematic perspective view of a spin-rinse-dry chamber of the present invention, incorporating rinsing and dissolving fluid inlets.
Figure 5:
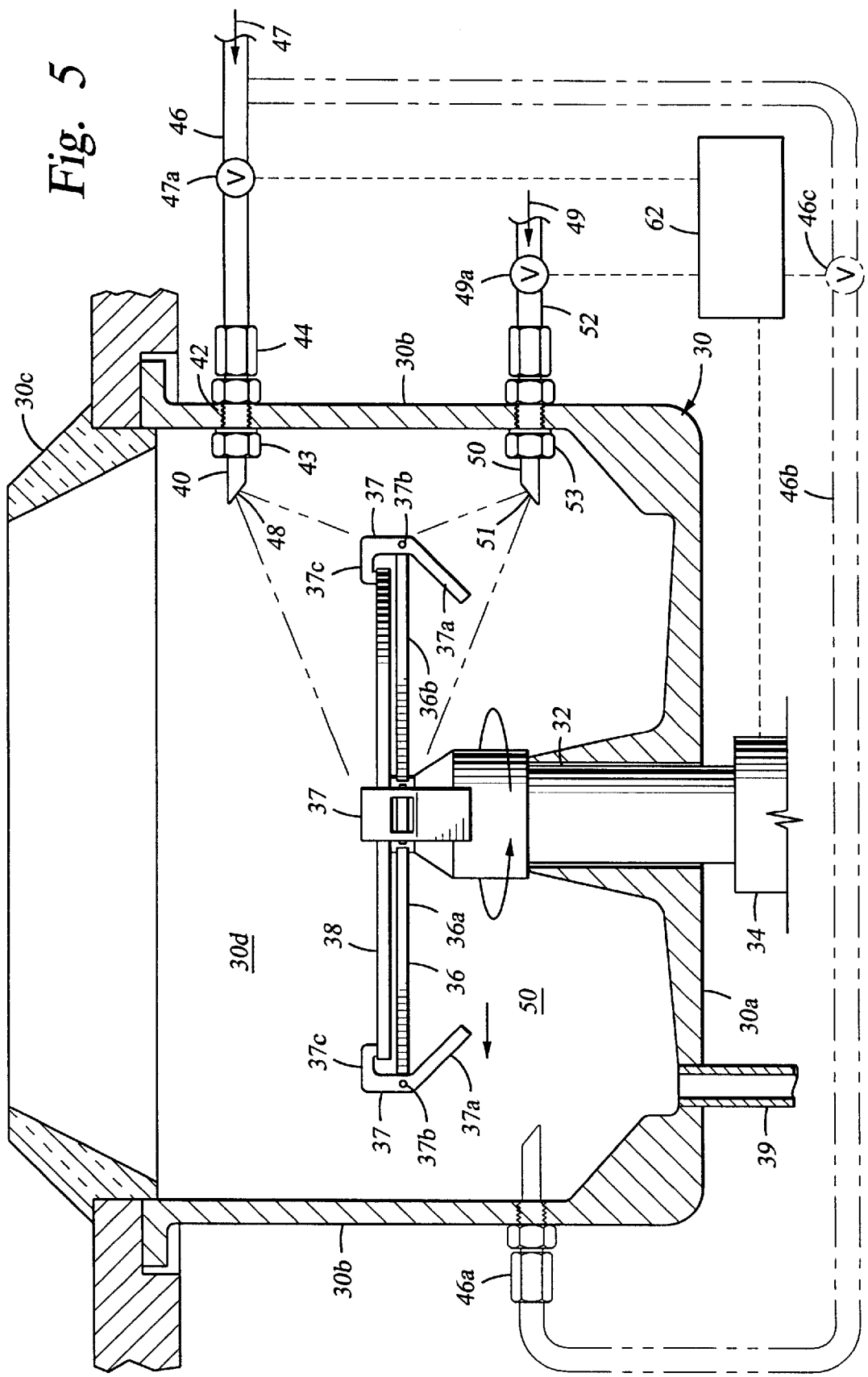
FIG. 5 is a side view of the spin-rinse-dry chamber of FIG. 4.

FIG. 4 is a schematic perspective view of a spin-rinse-dry chamber of the present invention, incorporating rinsing and dissolving fluid inlets. FIG. 5 is a side view of the spin-rinse-dry chamber of FIG. 4 and shows a substrate in a processing position vertically disposed between fluid inlets. Referring to FIGS. 4 and 5, the chamber 30 comprises bottom 30a and a sidewall 30b, and an upper shield 30c which collectively define a chamber bowl 30d, where the shield attaches to the sidewall and assists in retaining the fluids within the chamber. Alternatively, the removable cover, shown in FIG. 3, could also be used. A pedestal 36, located in the chamber, includes a pedestal support 32 and a pedestal actuator 34. The pedestal 36 supports the substrate 38 (shown in FIG. 5) on the pedestal upper surface during processing. The pedestal actuator 34 rotates the pedestal to spin the substrate and raises and lowers the pedestal as described below. The substrate may be held in place on the pedestal by a plurality of clamps 37. The clamps pivot with centrifugal force and engage the substrate preferably in the edge exclusion zone of the substrate. In a preferred embodiment, the clamps engage the substrate only when the substrate lifts off the pedestal during the processing. Vacuum passages (not shown) may also be used as well as other holding elements. The pedestal has a plurality of pedestal arms 36a and 36b, so that the fluid through the second nozzle may impact as much surface area on the lower surface of the substrate as is practical. is An outlet 39 allows fluid to be removed from the chamber. The terms "below", "above", "bottom", "top", "up", "down", "upper", and "lower" and other positional terms used herein are shown with respect to the embodiments in the figures and may be varied depending on the relative orientation of the processing apparatus.

A first conduit 46, through which a first fluid 47 flows, is connected to a valve 47a The conduit may be hose, pipe, tube, or other fluid containing conduits. The valve 47a controls the flow of the first fluid 47 and may be selected from a variety of valves including a needle, globe, butterfly, or other valve types and may include a valve actuator, such as a solenoid, that can be controlled with a controller 62. The conduit 46 connects to a first fluid inlet 40 that is located above the substrate and includes a mounting portion 42 to attach to the chamber and a connecting portion 44 to attach to the conduit 46. The first fluid inlet is shown with a single first nozzle 48 to deliver a first fluid 47 under pressure onto the substrate upper surface. However, multiple nozzles could be used and multiple fluid inlets could be positioned about the inner perimeter of the chamber. Preferably, nozzles placed above the substrate should be outside the diameter of the substrate to lessen the risk of the nozzles dripping on the substrate. The first fluid inlet could be mounted in a variety of locations, including through a cover positioned above the substrate, such as shown in FIG. 3. Additionally, the nozzle may articulate to a variety of positions using an articulating member 43, such as a ball and socket joint.

Similar to the first conduit and related elements described above, a second conduit 52 is connected to a control valve 49a and a second fluid inlet 50 with a second nozzle 51. The second fluid inlet 50 is shown below the substrate and angled upward to direct a second fluid under the substrate through the second nozzle 51. Similar to the first fluid inlet, the second fluid inlet may include a plurality of nozzles, a plurality of fluid inlets and mounting locations, and a plurality of orientations including using the articulating member 53. Each fluid inlet could be extended into the chamber at a variety of positions. For instance, if the flow is desired to be a certain angle that is directed back toward the chamber periphery along the edge of the substrate, the nozzles could be extended radially inward and the discharge from the nozzles be directed back toward the chamber periphery.

The controller 62 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 46a connected to the first conduit 46 with a conduit 46b and having a control valve 46c, which may be used to flow a rinsing fluid on the backside of the substrate after the dissolving fluid is flown without having to reorient the substrate or switch the flow through the second fluid inlet to a rinsing fluid.

In one embodiment, the substrate is mounted with the deposition surface of the disposed face up in the chamber bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuric acid, phosphoric acid, hydrofluoric acid, or other dissolving liquids or fluids, depending on the material to be dissolved.

In operation, the pedestal is in a raised position, shown in FIG. 4, and a robot (not shown) places the substrate, front side up, onto the pedestal. The pedestal lowers the substrate to a processing position where the substrate is vertically disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 37a of the clamps to rotate outward about pivot 37b, toward the periphery of the chamber sidewall, due to centrifugal force. The clamp rotation forces the upper end 37c of the clamp inward and downward to center and hold the substrate 38 in position on the pedestal 36, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 40. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located. In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm wafer.

The invention could also be used to remove the unwanted deposits along the edge of the substrate to create the edge exclusion zone shown in FIG. 2. By adjustment of the orientation and placement of the nozzles, the flow rates of the fluids, the rotational speed of the substrate, and the chemical composition of the fluids, the unwanted deposits could be removed from the edge and/or edge exclusion zone of the substrate as well. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while dispensing the dissolving fluid on the backside of the substrate. The centrifugal force moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process of the present invention described above.

Figure 6:
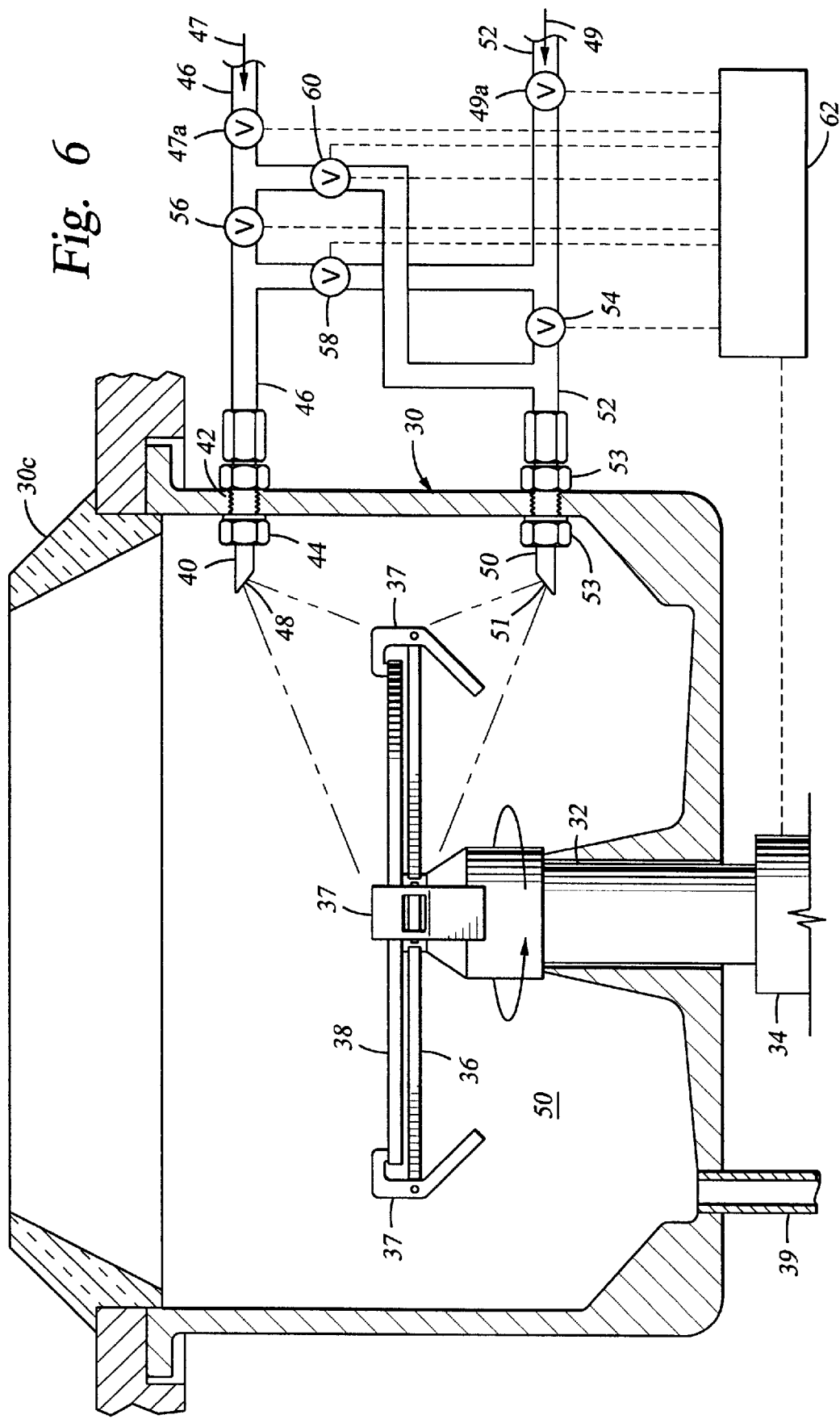
FIG. 6 is a schematic of an alternative embodiment of the spin-rinse-dry chamber of FIG. 5 with reversing fluid inlets.

FIG. 6 is another embodiment of the present invention similar to FIG. 5, in which the first and second fluid flows are reversible through a valving system without reattaching conduits and re-plumbing the system. A first conduit 46, through which a first fluid 47 flows, is connected to a control valve 47a and, similar to the embodiment shown in FIG. 5, can be controlled with a controller 62. The conduit 46 connects to a series of valves 54, 56, 58, and 60, to be described below, and then connects to a first fluid inlet 40 with a first nozzle 48 that is located above the substrate and includes a mounting portion 42 to attach to the chamber and a connecting portion 44 to attach to the conduit 46. Also, similar to the embodiment of FIG. 5, the first fluid inlet may include a plurality of nozzles in a plurality of locations about the periphery of the chamber and may articulate about the articulating member 43. Similar to the first conduit and related elements described above, a second conduit 52 is connected to a control valve 49a and then a series of valves 54, 56, 58, and 60, and then connects to a second fluid inlet 50 with a second nozzle 51 with an articulating member 53.

The valving system, represented by 54, 56, 58, and 60, may be manually or automatically actuated, such as with the controller 62. The valves could be solenoid operated to assist in the remote operation of the system. The control valves 47a and 49a may be used to adjust the flow as described in FIGS. 4 and 5. A further advantage of this arrangement is that the flows can be sequenced in a variety of ways. For instance, a dissolving fluid flowing through the second fluid inlet could be purged with a rinsing fluid by opening and closing the respective valves and rinsing the substrate surface that the dissolving fluid has contacted. Furthermore, a single fluid flow, instead of the dual fluid flow described above, could also be effected by closing all but one of the valves. The following table shows examples of possible variations to effect different flow regimes in the rinsing and/or dissolving processes of the invention.

TABLE 1

| Valve 54 | Valve 56 | Valve 58 | Valve 60 | Effect |
| --- | --- | --- | --- | --- |
| Closed | Closed | Closed | Closed | No flow |
| Open | Open | Closed | Closed | 47–40, 49–50 |
| Closed | Closed | Open | Open | 47–50, 49–40 |
| Open | Closed | Open | Closed | 49–40 & 50 |
| Closed | Open | Closed | Open | 47–40 & 50 |
| Open | Closed | Closed | Closed | 49–50 |
| Closed | Open | Open | Open | 47–40 |
| Closed | Closed | Open | Closed | 49–40 |
| Closed | Closed | Closed | Open | 47–50 |

Referring to Table 1, the first valve position sequence indicates that no flow would occur when valves 54, 56, 58, and 60 are closed. This configuration could be appropriate when, for instance, the substrate was placed on or removed from the pedestal. The next row indicates that by closing valves 58 and 60 and opening valves 54 and 56, the first fluid 47 would flow through the first conduit 46 to the first fluid inlet 40, and the second fluid 49 would flow through the second conduit 52 to the second fluid inlet 50. This state would resemble the embodiment discussed in FIG. 2 where, if the backside was facing down, the first conduit would flow a rinsing fluid through the first fluid inlet and the second conduit would flow a dissolving fluid from the second fluid inlet. Without having to re-plumb the first fluid and second fluids from their respective conduits, if the substrate backside was facing up, and the first conduit 46 still contained the rinsing fluid and the second conduit 52 still contained the dissolving fluid, then by switching valve positions the flow could be adjusted. To allow the dissolving fluid to flow through the first fluid inlet 40 and the rinsing fluid to flow through the second fluid inlet 50, valves 54 and 56 would be closed and valves 58 and 60 would be open. If the process regime included a backside rinse after the dissolving fluid process, then the valves could be adjusted accordingly. For instance, if the backside was facing down and the first conduit 46 contained the rinsing fluid and the second conduit 52 contained the dissolving fluid, then valves 54 and 58 could be closed and valves 56 and 60 opened to allow the rinsing fluid to flow through both the first fluid inlet 40 and second fluid inlet 50. Alternatively, the rinsing fluid from the first conduit 46 could flow through just the second fluid inlet 50 without flowing through the first fluid inlet 40 by closing valves 54, 56, and 58 and opening valve 60. Other configurations are possible, some of which are shown in Table 1.

Furthermore, a preferred embodiment incorporates the spin-rinse-dry cycle for convenience and processing efficiency. Other embodiments might not include, for instance, the drying cycle or might include it in another chamber.

In another arrangement, the substrate is mounted with the substrate backside facing upward. This embodiment is more in keeping with standard electroplating processes where the desired surface to be plated is oriented down. The clamps 37 could be used to contact the substrate in the edge exclusion zone, as described above. The advantage of having a substrate inverted would be less substrate turning from chamber to chamber for improved efficiency. While similar to the above described process and apparatus in FIGS. 4 and 5, the rinsing and dissolving could be done, however, by switching the first and second fluids, so that the first fluid flown through the first fluid inlet is the dissolving fluid and the second fluid flown through the second fluid inlet is the rinsing fluid. In such an instance, the second fluid flow rate would preferably be greater than the first fluid flow rate to protect the substrate front side from the dissolving fluid. Also, various valving systems, such as the valving system described in FIG. 6, could be included into this embodiment.

While foregoing is directed to the preferred embodiment of the present invention, other and further embodiments of the invention may be devised without departing from the basis scope thereof, and the scope thereof is determined by the claims that follow.

What is claimed is:

1. A method of removing a film of deposited metal material, comprising:
   a) providing a substrate, wherein the substrate has a first surface and an opposing second surface, wherein one of the surfaces faces upward the other surface faces downward, and further wherein the substrate has the film of deposited metal material on at least the first surface and a portion of unwanted film of deposited material on the second surface; and
   b) rotating the substrate while simultaneously:
      delivering a rinse fluid to the first surface, wherein the rinse fluid substantially prevents dissolution of the film of the first surface; and
      delivering a dissolving fluid to the second surface without delivering the dissolving fluid to the first surface, thereby removing the material from at least the second surface.

2. The method of claim 1, wherein the first surface faces upward and the second surface faces downward and delivering the rinse onto the first surface at a greater flow rate compared to a flow rate of the dissolving fluid delivered onto the second surface.

3. The method of claim 2, wherein the rinse fluid comprises deionized water and the dissolving fluid comprises an acid.

4. The method of claim 3, wherein the metal material comprises copper and the acid comprises hydrochloric acid.

5. The method of claim 1, wherein the first surface faces downward and second surface faces upward and delivering the rinse onto the first surface at a greater flow rate compared to a flow rate of the dissolving fluid delivered onto the second surface.

6. The method of claim 1, wherein delivering a rinse fluid and delivering a dissolving fluid occurs independently of mechanical scrubbing.

7. The method of claim 1, further comprising dissolving at least a portion of any film deposited on an edge of the substrate.

8. The method of claim 1, further comprising dissolving at least a portion of the film deposited in an edge exclusion zone of the second surface.

9. A method of removing a metal material deposited on the front side of a substrate and at least a portion of a back side of the substrate, comprising:
   a) directing a non-etchant fluid onto the material deposited on the front side to substantially prevent dissolution of material on the front side; while simultaneously
   b) dissolving at least a portion of the material deposited on the backside without dissolving the material on the front side.

10. The method of claim 9, wherein directing the fluid onto the material comprises using a chamber adapted to spin and rinse the substrate.

11. The method of claim 9, further comprising processing the substrate with a chamber adapted to spin and rinse the substrate while in-situ dissolving the portion of the deposited material from the backside using an acid.

12. The method of claim 9, further comprising dissolving material deposited on an edge of the substrate.

13. The method of claim 9, further comprising dissolving the deposited material in an edge exclusion zone on the backside of substrate.

14. The method of claim 9, wherein directing the fluid onto the material on the front side comprises rinsing the material on the front side.

15. The method of claim 14, further comprising substantially preventing dissolution of the film on the front side by directing the rinsing fluid onto the front side at a greater flow rate compared to a flow rate of the dissolving fluid directed onto the backside.

16. A method of removing a film of deposited metal material, comprising:
   a) providing a substrate, wherein the substrate has a first surface and an opposing second surface, wherein one of the surfaces faces upward the other surface faces downward, and further wherein the substrate has the film of deposited metal material on a least the first surface and a portion of unwanted film of deposited material on the second surface; and
   b) providing means for, rotating the substrate while simultaneously:
      delivering a rinse fluid to the first surface, wherein the rinse fluid substantially prevents dissolution of the film on the first surface; and
      delivering a dissolving fluid to the second surface without delivering the dissolving fluid to the first surface, thereby removing the material from at least the second surface.

17. A method of removing a metal material deposited on the front side of a substrate and at least a portion of a back side of the substrate, comprising simultaneously:
   a) steps for directing a non-etchant fluid onto the material deposited on the front side to substantially prevent dissolution of material on the front side; and
   b) steps for dissolving at least a portion of the material deposited on the backside without dissolving the material on the front side.

* * * * *

UNITED STATES PATENT AND TRADEMARK OFFICE
CERTIFICATE OF CORRECTION

PATENT NO. : 6,290,865 B1
DATED : September 18, 2001
INVENTOR(S) : Lloyd et al.

It is certified that error appears in the above-identified patent and that said Letters Patent is hereby corrected as shown below:

<u>Title page,</u>
Item [30], please replace "3-220723" with -- 3-220723A --.
Item [30], please replace "6-97136" with -- 6-97136A --.

<u>Column 4,</u>
Line 47, please delete "is" after "practical.".

<u>Column 10,</u>
Line 15, please replace "a least" with -- at least --.

Signed and Sealed this

Fourth Day of June, 2002

*Attest:*

*Attesting Officer*

JAMES E. ROGAN
*Director of the United States Patent and Trademark Office*